US012656695B2

(12) United States Patent　　　　(10) Patent No.: US 12,656,695 B2
Yamada　　　　　　　　　　　　　　　(45) Date of Patent: Jun. 16, 2026

(54) ELECTRIC COMPONENT BOX AND EXTREME ULTRAVIOLET LIGHT GENERATION APPARATUS

(71) Applicant: Gigaphoton Inc., Tochigi (JP)

(72) Inventor: Ken Yamada, Oyama (JP)

(73) Assignee: Gigaphoton Inc., Tochigi (JP)

( * ) Notice: Subject to any disclaimer, the term of this patent is extended or adjusted under 35 U.S.C. 154(b) by 103 days.

(21) Appl. No.: 18/907,047

(22) Filed: Oct. 4, 2024

(65) Prior Publication Data

US 2025/0138438 A1　　May 1, 2025

(30) Foreign Application Priority Data

Nov. 1, 2023　(JP) ................................. 2023-188024

(51) Int. Cl.
　*G03F 7/00*　　　　(2006.01)
　*H05K 5/02*　　　　(2006.01)
(52) U.S. Cl.
　CPC ....... *G03F 7/70825* (2013.01); *H05K 5/0226* (2013.01); *H05K 5/0234* (2013.01); *G03F 7/70033* (2013.01)
(58) Field of Classification Search
　CPC ............. G03F 7/70825; G03F 7/70025; G03F 7/70033; H05K 5/0226; H05K 5/0234; H05K 5/30
　See application file for complete search history.

(56) References Cited

U.S. PATENT DOCUMENTS

| | | | | | |
|---|---|---|---|---|---|
| 7,859,839 | B2 * | 12/2010 | Wada | ................... | G11B 33/142 |
| | | | | | 361/695 |
| 2004/0108473 | A1 * | 6/2004 | Melnychuk | ............ | H05G 2/009 |
| | | | | | 250/504 R |
| 2010/0156253 | A1 * | 6/2010 | Ohfuchi | ............... | H05K 7/1467 |
| | | | | | 312/201 |
| 2011/0309270 | A1 * | 12/2011 | Yamanouchi | ....... | G03F 7/70033 |
| | | | | | 250/504 R |

FOREIGN PATENT DOCUMENTS

| | | | | |
|---|---|---|---|---|
| JP | H05336623 | A | * | 12/1993 |
| JP | 2012-005951 | A | | 1/2012 |

OTHER PUBLICATIONS

Machine translation of JP-H05336623-A (Year: 1993).*

* cited by examiner

*Primary Examiner* — Steven H Whitesell
(74) *Attorney, Agent, or Firm* — Studebaker Brackett PLLC

(57)　　　　ABSTRACT

An electric component box includes a first box into which a wiring from the extreme ultraviolet light generation chamber device is introduced and capable of being fixed to a placement surface; a second box into which a wiring from the first box is introduced and capable of being switched, by being raised and lowered, between a fixed state and a movable state; and a connection device providing connection as allowing the second box to be rotatable with respect to the first box, from a facing state in which a predetermined side wall of the first box and a predetermined side wall of the second box face each other, in a direction in which the predetermined side wall of the first box and the predetermined side wall of the second box move away from each other, and to be capable of being raised and lowered with respect to the first box.

13 Claims, 15 Drawing Sheets

ELECTRIC COMPONENT BOX AND EXTREME ULTRAVIOLET LIGHT GENERATION APPARATUS

CROSS-REFERENCE TO RELATED APPLICATIONS

The present application claims the benefit of Japanese Patent Application No. 2023-188024, filed on Nov. 1, 2023, the entire contents of which are hereby incorporated by reference.

BACKGROUND

1. Technical Field

The present disclosure relates to an electric component box and an extreme ultraviolet light generation apparatus.

2. Related Art

Recently, miniaturization of a transfer pattern in optical lithography of a semiconductor process has been rapidly proceeding along with miniaturization of the semiconductor process. In the next generation, microfabrication at 10 nm or less will be required. Therefore, it is expected to develop a semiconductor exposure apparatus that combines an apparatus for generating extreme ultraviolet (EUV) light having a wavelength of about 13 nm with a reduced projection reflection optical system.

As the EUV light generation apparatus, a laser produced plasma (LPP) type apparatus using plasma generated by irradiating a target substance with laser light has been developed.

LIST OF DOCUMENTS

Patent Documents

Patent Document 1: Japanese Patent Application Publication No. 2012-5951

SUMMARY

An electric component box according to an aspect of the present disclosure is an electric component box for accommodating an electric component to be connected to an electric component of an extreme ultraviolet light generation chamber device. The electric component box may include a first box into which a wiring from the extreme ultraviolet light generation chamber device is introduced and which is capable of being fixed to a placement surface; a second box into which a wiring from the first box is introduced and which is capable of being switched, by being raised and lowered, between a fixed state of being fixed to the placement surface and a movable state of being movable on the placement surface; and a connection device providing connection between the first box and the second box as allowing the second box to be rotatable with respect to the first box, from a facing state in which a predetermined side wall of the first box and a predetermined side wall of the second box face each other, in a direction in which the predetermined side wall of the first box and the predetermined side wall of the second box move away from each other from the facing state, and to be capable of being raised and lowered with respect to the first box.

Further, an extreme ultraviolet light generation apparatus according to an aspect of the present disclosure includes an extreme ultraviolet light generation chamber device configured to generate plasma by irradiation of a target substance with laser light, and an electric component box for accommodating an electric component to be connected to an electric component of the extreme ultraviolet light generation chamber device. Here, the electric component box may include a first box into which a wiring from the extreme ultraviolet light generation chamber device is introduced and which is capable of being fixed to a placement surface; a second box into which a wiring from the first box is introduced and which is capable of being switched, by being raised and lowered, between a fixed state of being fixed to the placement surface and a movable state of being movable on the placement surface; and a connection device providing connection between the first box and the second box as allowing the second box to be rotatable with respect to the first box, from a facing state in which a predetermined side wall of the first box and a predetermined side wall of the second box face each other, in a direction in which the predetermined side wall of the first box and the predetermined side wall of the second box move away from each other from the facing state, and to be capable of being raised and lowered with respect to the first box.

BRIEF DESCRIPTION OF THE DRAWINGS

Embodiments of the present disclosure will be described below merely as examples with reference to the accompanying drawings.

DESCRIPTION OF EMBODIMENTS

Figure 1:
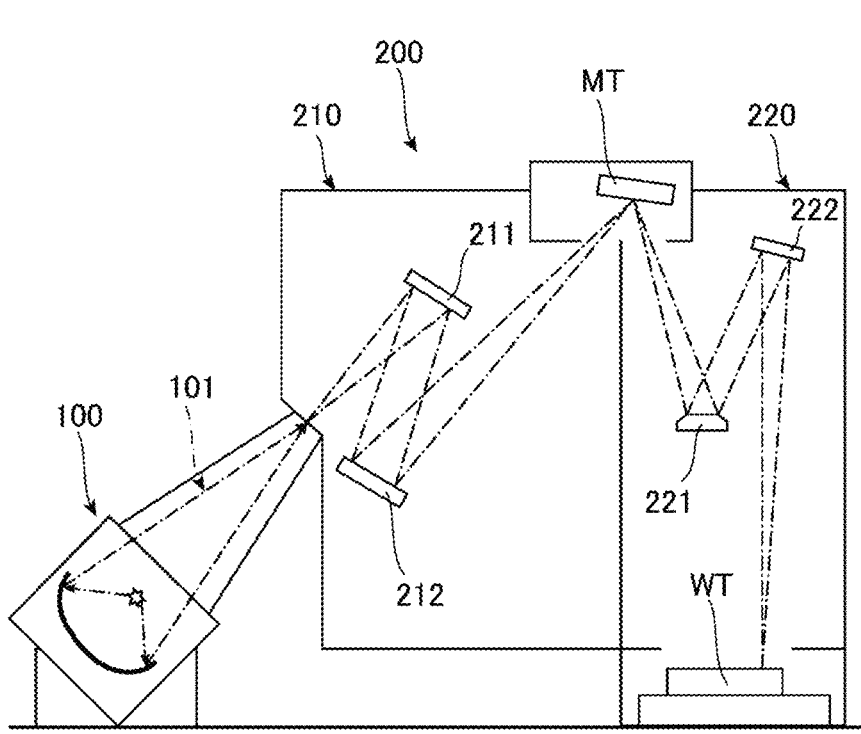
FIG. 1 is a schematic view showing a schematic configuration example of an entire apparatus using an extreme ultraviolet generation apparatus.

1. Overview
2. Description of apparatus using extreme ultraviolet light generation apparatus
3. Description of extreme ultraviolet light generation apparatus of comparative example
   3.1 Configuration
   3.2 Operation
   3.3 Problem
4. Description of extreme ultraviolet light generation apparatus of first embodiment
   4.1 Configuration
   4.2 Operation
   4.3 Effect Hereinafter, embodiments of the present disclosure will be described in detail with reference to the drawings. The embodiments described below show some examples of the present disclosure and do not limit the contents of the present disclosure. Also, all configurations and operation described in the embodiments are not necessarily essential as configurations and operation of the present disclosure. Here, the same components are denoted by the same reference numeral, and duplicate description thereof is omitted.

1. Overview

The embodiments of the present disclosure relate to an electric component box and an extreme ultraviolet light generation apparatus for generating light having a wavelength of extreme ultraviolet (EUV). In the following, extreme ultraviolet light is referred to as EUV light in some cases.

2. Description of Apparatus Using Extreme Ultraviolet Light Generation Apparatus FIG. 1 is a schematic view showing a schematic configuration example of an entire apparatus using an EUV light generation apparatus. The apparatus using the EUV light generation apparatus shown in FIG. 1 is an apparatus for manufacturing an electronic device, and includes an EUV light generation apparatus 100 and an exposure apparatus 200. The exposure apparatus 200 includes a mask irradiation unit 210 including a plurality of mirrors 211, 212 that configure a reflection optical system, and a workpiece irradiation unit 220 including a plurality of mirrors 221, 222 that configure a reflection optical system different from the reflection optical system of the mask irradiation unit 210. The mask irradiation unit 210 illuminates, via the mirrors 211, 212, a mask pattern of a mask table MT with EUV light 101 incident from the EUV light generation apparatus 100. The workpiece irradiation unit 220 images the EUV light 101 reflected by the mask table MT onto a workpiece (not shown) arranged on a workpiece table WT via the mirrors 221, 222. The workpiece is a photosensitive substrate such as a semiconductor wafer on which photoresist is applied. The exposure apparatus 200 synchronously translates the mask table MT and the workpiece table WT to expose the workpiece to the EUV light 101 reflecting the mask pattern. Through the exposure process as described above, a device pattern is transferred onto the semiconductor wafer, thereby a semiconductor device can be manufactured.

3. Description of Extreme Ultraviolet Light Generation Apparatus of Comparative Example

3.1 Configuration

The EUV light generation apparatus 100 of a comparative example will be described. The comparative example of the present disclosure is an example recognized by the applicant as known only by the applicant, and is not a publicly known example admitted by the applicant.

Figure 2:
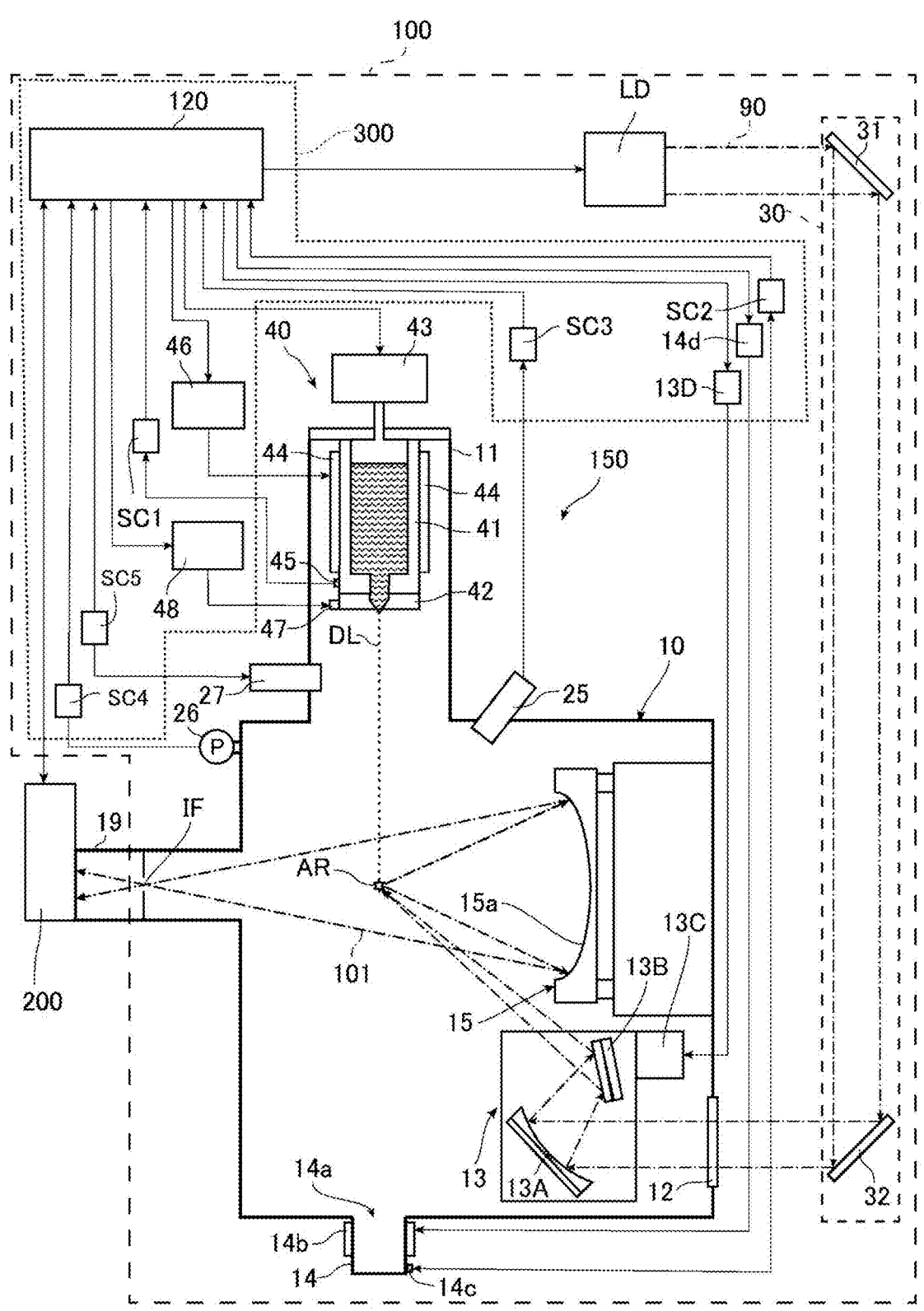
FIG. 2 is a schematic view showing a schematic configuration example of the entire extreme ultraviolet light generation apparatus of a comparative example.

FIG. 2 is a schematic view showing a schematic configuration example of the entire EUV light generation apparatus 100 of the present example. As shown in FIG. 2, the EUV light generation apparatus 100 includes an EUV light generation chamber device 150, an electric component box 300, a laser device LD, and a laser light delivery optical system 30 as a main configuration. The EUV light generation chamber device 150 includes a chamber 10 as a main configuration.

The chamber 10 is a sealable container. The chamber 10 includes a sub-chamber 11, and a target supply unit 40 is attached to the sub-chamber 11 to penetrate a wall of the sub-chamber 11. The target supply unit 40 includes a tank 41, a nozzle 42, and a pressure regulator 43 to supply a droplet target DL to the internal space of the chamber 10. The droplet target DL is sometimes abbreviated as a droplet or a target.

The tank 41 stores therein a target substance which becomes the droplet target DL. The target substance contains tin. The inside of the tank 41 is in communication with the pressure regulator 43 which adjusts the pressure in the tank 41. A heater 44 and a temperature sensor 45 are attached to the tank 41. The heater 44 heats the tank 41 with current applied from a heater power source 46. Through the heating, the target substance in the tank 41 melts. The temperature sensor 45 measures, via the tank 41, the temperature of the target substance in the tank 41. The pressure regulator 43 and the heater power source 46 are electrically connected to a processor 120, and the temperature sensor 45 is electrically connected to the processor 120 via a signal converter SC1. The temperature sensor 45 outputs a signal indicating the temperature of the target substance to the signal converter SC1, and the signal converter SC1 converts the signal and outputs the converted signal to the processor 120.

The nozzle 42 is attached to the tank 41 and outputs the target substance. A piezoelectric element 47 is attached to the nozzle 42. The piezoelectric element 47 is electrically connected to a piezoelectric power source 48 and is driven by a voltage applied from the piezoelectric power source 48. The piezoelectric power source 48 is electrically connected to the processor 120. The target substance output from the nozzle 42 is formed into the droplet target DL through operation of the piezoelectric element 47.

The chamber 10 includes a target collection unit 14. The target collection unit 14 is a box body attached to the chamber 10 and communicates with the internal space of the chamber 10 through an opening 14a formed at the chamber 10. The opening 14a is arranged directly below the nozzle 42. The target collection unit 14 is a drain tank to collect any unnecessary droplet target DL having passed through the opening 14a and reaching the target collection unit 14. A collection unit heater 14b and a collection unit temperature sensor 14c are attached to the target collection unit 14. The collection unit heater 14b heats the target collection unit 14 with current supplied from a collection unit heater power source 14d. Through the heating, the target substance in the target collection unit 14 melts. The collection unit temperature sensor 14c measures the temperature of the target substance in the target collection unit 14. The collection unit temperature sensor 14c is electrically connected to the processor 120 via a signal converter SC2, and the collection unit heater power source 14d is electrically connected to the processor 120. The collection unit temperature sensor 14c outputs a signal indicating the temperature of the target substance to the signal converter SC2, and the signal converter SC2 converts the signal and outputs the converted signal to the processor 120.

The chamber 10 is provided with a window 12 through which light from the outside is transmitted, and pulse laser light 90 output from the laser device LD is transmitted through the window 12.

Further, a laser light concentrating optical system 13 is arranged at the internal space of the chamber 10. The laser light concentrating optical system 13 includes a laser light concentrating mirror 13A and a high reflection mirror 13B. The laser light concentrating mirror 13A reflects and concentrates the laser light 90 having transmitted through the window 12. The high reflection mirror 13B reflects the laser light 90 concentrated by the laser light concentrating mirror 13A. Positions of the laser light concentrating mirror 13A and the high reflection mirror 13B are changed by operation of the laser light manipulator 13C, and the light concentration position of the laser light 90 at the internal space of the chamber 10 is changed due to the change of the positions. A driver 13D is electrically connected to the laser light manipulator 13C, and the processor 120 is electrically connected to the driver 13D. The driver 13D controls operation of the laser light manipulator 13C by a signal from the processor 120, and the positions of the laser light concentrating mirror 13A and the high reflection mirror 13B are adjusted. The positions of the laser light concentrating mirror 13A and the high reflection mirror 13B are adjusted so that the concentration position of the laser light 90 is positioned directly below the nozzle 42. When the target substance is irradiated with the laser light 90 at the concentration position, plasma is generated from the target substance, and the EUV light 101 is radiated from the plasma. The region in which plasma is generated is sometimes referred to as a plasma generation region AR. The plasma generation region AR is a region having a radius of, for example, 40 mm about the plasma point and is located at the internal space of the chamber 10.

For example, an EUV light concentrating mirror 15 having a spheroidal reflection surface 15a is arranged at the internal space of the chamber 10. The EUV light concentrating mirror 15 includes, for example, a multilayer film in which silicon layers and molybdenum layers are alternately laminated, and reflects the EUV light 101 by the multilayer film. The EUV light concentrating mirror 15 is provided at a position not overlapping the laser light 90 at the internal space of the chamber 10. The reflection surface 15a reflects the EUV light 101 radiated from the plasma in the plasma generation region AR. The reflection surface 15a has a first focal point and a second focal point. The reflection surface 15a may be arranged such that, for example, the first focal point is located in the plasma generation region AR and the second focal point is located at an intermediate focal point IF.

The EUV light generation apparatus 100 includes a connection portion 19 providing communication between the internal space of the chamber 10 and the internal space of the exposure apparatus 200. A wall in which an aperture is formed is arranged in the connection portion 19. The wall is preferably arranged such that the aperture is located at the second focal point. The connection portion 19 is an outlet port of the EUV light 101 in the chamber 10, and the EUV light 101 is output from the connection portion 19 and enters the exposure apparatus 200.

A light amount sensor 25 is attached to the chamber 10. The light amount sensor 25 includes, for example, an imaging function, and measures the light amount of the EUV light 101 entering the exposure apparatus 200 from the light amount of the EUV light 101 emitted from plasma. The light amount sensor 25 is electrically connected to the processor 120 via a signal converter SC3. The light amount sensor 25 outputs a signal indicating the light amount of the EUV light 101 entering the exposure apparatus 200 to the signal converter SC3, and the signal converter SC3 converts the signal and outputs the converted signal to the processor 120.

Further, the EUV light generation apparatus 100 includes a pressure sensor 26 and a detection unit 27 as a target sensor. The pressure sensor 26 and the detection unit 27 are attached to the chamber 10. The pressure sensor 26 is electrically connected to the processor 120 via a signal converter SC4, and the detection unit 27 is electrically connected to the processor 120 via a signal converter SC5. The pressure sensor 26 measures the pressure at the internal space of the chamber 10 and outputs a signal indicating the pressure to the signal converter SC4. The signal converter SC4 converts the signal and outputs the converted signal to the processor 120.

The detection unit 27 has, for example, an imaging function, and detects the presence, trajectory, position, velocity, and the like of the droplet target DL output from a nozzle hole of the nozzle 42 in accordance with an instruction from the processor 120. The detection unit 27 may be arranged inside the chamber 10, or may be arranged outside the chamber 10 and detect the droplet target DL through a window (not shown) arranged on a wall of the chamber 10. The detection unit 27 includes a light receiving optical system (not shown) and an imaging unit (not shown) such as a charge-coupled device (CCD) or a photodiode. In order to improve the detection accuracy of the droplet target DL, the light receiving optical system forms an image of the trajectory of the droplet target DL and the periphery thereof on a light receiving surface of the imaging unit. When the droplet target DL passes through a light concentration region of a light source (not shown) arranged to improve contrast in the field of view of the detection unit 27, the imaging unit detects a change of the light passing through the trajectory of the droplet target DL and the periphery thereof. The imaging unit converts the detected light change into a signal related to image data of the droplet target DL. The imaging unit outputs the electric signal to the signal converter SC5, and the signal converter SC5 converts the signal and outputs the converted signal to the processor 120.

The laser device LD includes a master oscillator being a light source to perform burst operation. The master oscillator outputs the pulse laser light 90 in a burst-on duration. The master oscillator is, for example, a solid-state laser device that excites a YAG crystal to which niobium (Nb) or ytterbium (Yb) is added, or a laser device that outputs the laser light 90 by exciting a gas in which helium, nitrogen, or the like is mixed in a carbon dioxide gas through electric discharge. Alternatively, the master oscillator may be a quantum cascade laser device. The master oscillator may output the pulse laser light 90 by a Q switch system. Further, the master oscillator may include an optical switch, a polarizer, and the like. The laser device LD may include an amplifier that amplifies the laser light 90 output from the master oscillator. In the burst operation, the pulse laser light 90 is continuously output at a predetermined repetition frequency in the burst-on duration and the output of the laser light 90 is stopped in a burst-off duration.

The travel direction of the laser light 90 output from the laser device LD is adjusted by the laser light delivery optical system 30. The laser light delivery optical system 30 includes a plurality of mirrors 31, 32 for adjusting the travel direction of the laser light 90. The position of at least one of the mirrors 31, 32 is adjusted by an actuator (not shown). Owing to that the position of at least one of the mirrors 31, 32 is adjusted, the laser light 90 can appropriately propagate to the internal space of the chamber 10 through the window 12.

The processor 120 of the present disclosure is a processing device including a storage device in which a control program is stored and a central processing unit (CPU) that executes the control program. The processor 120 is specifically configured or programmed to perform various processes included in the present disclosure and controls the entire EUV light generation apparatus 100. The processor 120 receives a signal related to the pressure at the internal space of the chamber 10 measured by the pressure sensor 26, a signal related to image data of the droplet target DL captured by the detection unit 27, a burst signal instructing the burst operation from the exposure apparatus 200, and the like. The processor 120 processes the various signals, and may control, for example, the timing at which the droplet target DL is output, the output direction of the droplet target DL, and the like. Further, the processor 120 may control the output timing of the laser device LD, the travel direction and the concentration position of the laser light 90, and the like. The above-described various kinds of control are merely examples, and as will be described later, other control may be added as necessary.

Figure 3:
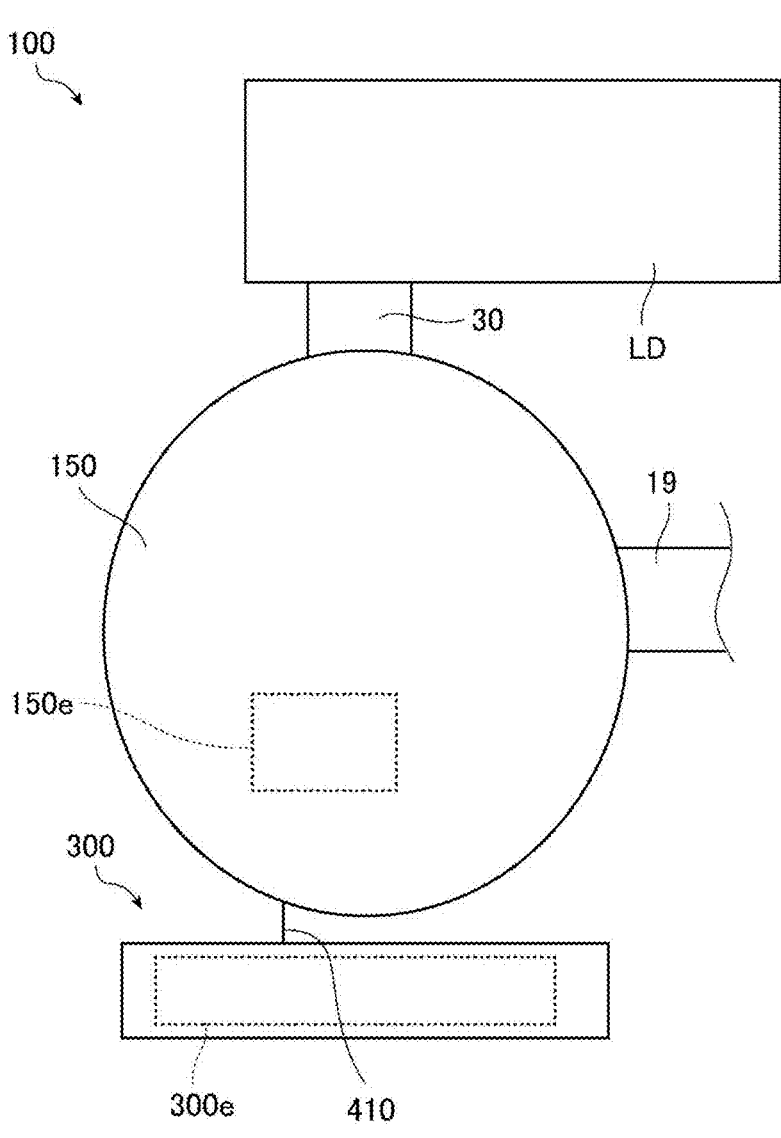
FIG. 3 is a schematic view of the extreme ultraviolet generation apparatus of the comparative example viewed from the upper side.

FIG. 3 is a schematic view of the EUV light generation apparatus 100 of the comparative example viewed from the upper side. As shown in FIG. 3, the electric component box 300 is a box-shaped member arranged around the EUV light generation chamber device 150. The electric component box 300 of the present example is a rectangular parallelepiped shape elongated along the outer periphery of the EUV light generation chamber device 150, and is fixed to a mounting surface thereof on which the electric component box 300 is mounted.

A wiring 410 electrically connected to electric components 150e of the EUV light generation chamber device 150 is introduced into the electric component box 300. Examples of the electric components 150e include the pressure regulator 43, the heater 44, the temperature sensor 45, the piezoelectric element 47, the collection unit heater 14b, the collection unit temperature sensor 14c, the laser light manipulator 13C, the light amount sensor 25, the pressure sensor 26, and the detection unit 27. Electric components 300e electrically connected to the electric components 150e by the wiring 410 are accommodated at the internal space of the electric component box 300. Examples of the electric components 300e include the processor 120, the heater power source 46, the piezoelectric power source 48, the collection unit heater power source 14d, the driver 13D, and the signal converters SC1 to SC5. The material configuring the electric component box 300 is, for example, a metal.

3.2 Operation

Next, operation of the EUV light generation apparatus 100 of the comparative example will be described.

In order to heat and maintain the target substance in the tank 41 to and at a predetermined temperature equal to or higher than the melting point, the processor 120 causes the heater power source 46 to supply current to the heater 44 to increase temperature of the heater 44. In this case, the processor 120 controls the temperature of the target substance to the predetermined temperature by adjusting a value of the current to be supplied from the heater power source 46 to the heater 44 based on an output from the temperature sensor 45. When the target substance is tin, the predetermined temperature is equal to or higher than 231.93° C. being the melting point of tin and, for example, is 240° C. or higher and 290° C. or lower. Thus, the preparation for outputting the droplet target DL is completed.

When the preparation is completed, the processor 120 causes the pressure regulator 43 to supply the inert gas from a gas supply source (not shown) to the tank 41 and to adjust the pressure in the tank 41 so that the molten target substance is output through the nozzle hole of the nozzle 42 at a predetermined velocity. Under this pressure, the target substance is output into the chamber 10 through the nozzle hole of the nozzle 42. The target substance output through the nozzle hole may be in the form of jet. At this time, the processor 120 causes the piezoelectric power source 48 to apply a voltage having a predetermined waveform to the piezoelectric element 47 to generate the droplet target DL. The piezoelectric power source 48 applies the voltage so that the waveform of the voltage value becomes, for example, a sine wave, a rectangular wave, or a sawtooth wave. Vibration of the piezoelectric element 47 can propagate through the nozzle 42 to the target substance to be output through the nozzle hole of the nozzle 42. The target substance is divided at a predetermined cycle by the vibration into liquid droplet targets DL. The diameter of the droplet target DL is approximately 10 μm or more and 30 μm or less.

When the droplet target DL is output, the droplet target DL travels to the plasma generation region AR. The detection unit 27 detects the passage timing of the droplet target DL passing through a predetermined position of the chamber 10. The processor 120 outputs a trigger signal to control the timing of outputting the laser light 90 from the laser device LD based on the signal from the detection unit 27 so that the droplet target DL is irradiated with the laser light 90. The trigger signal output from the processor 120 is input to the laser device LD. When the trigger signal is input, the laser device LD outputs the pulse laser light 90.

The output laser light 90 enters the laser light concentrating optical system 13 via the laser light delivery optical system 30 and the window 12. The laser light 90 travels from the laser light concentrating optical system 13 toward the plasma generation region AR. Then, the droplet target DL is irradiated with the laser light 90 in the plasma generation region AR. At this time, the processor 120 controls the laser light manipulator 13C of the laser light concentrating optical system 13 by the driver 13D so that the laser light 90 is concentrated in the plasma generation region AR. The processor 120 controls the timing outputting the laser light 90 from the laser device LD based on the signal from the detection unit 27 so that the droplet target DL is irradiated with the laser light 90. Thus, the droplet target DL is irradiated in the plasma generation region AR with the laser light 90 concentrated by the laser light concentrating mirror 13A. Plasma is generated by the irradiation, and light including the EUV light 101 is radiated from the plasma.

Among the light including the EUV light 101 generated in the plasma generation region AR, the EUV light 101 travels to the EUV light concentrating mirror 15, is concentrated at the intermediate focal point IF by the EUV light concentrating mirror 15, and then, enters the exposure apparatus 200 from the connection portion 19.

3.3 Problem

Examples of maintenance operation of the EUV light generation chamber device 150 include replacement of a mirror of the laser light concentrating optical system 13 and replacement of the target supply unit 40. A working space needs to be secured around the EUV light generation chamber device 150 to perform such operation. However, since the electric component box 300 is arranged around the EUV light generation chamber device 150 as shown in FIG. 3 to suppress an increase in size of the EUV light generation chamber device 100, it may be difficult to secure a working space.

Therefore, in the following embodiment, the EUV light generation apparatus 100 capable of securing a working space around the EUV light generation chamber device 150 while suppressing an increase in size will be exemplified.

4. Description of Extreme Ultraviolet Light Generation Apparatus of First Embodiment The configuration of the EUV light generation apparatus 100 of a first embodiment will be described. Any component same as that described above is denoted by an identical reference sign, and duplicate description thereof is omitted unless specific description is needed.

4.1 Configuration

Figure 4:
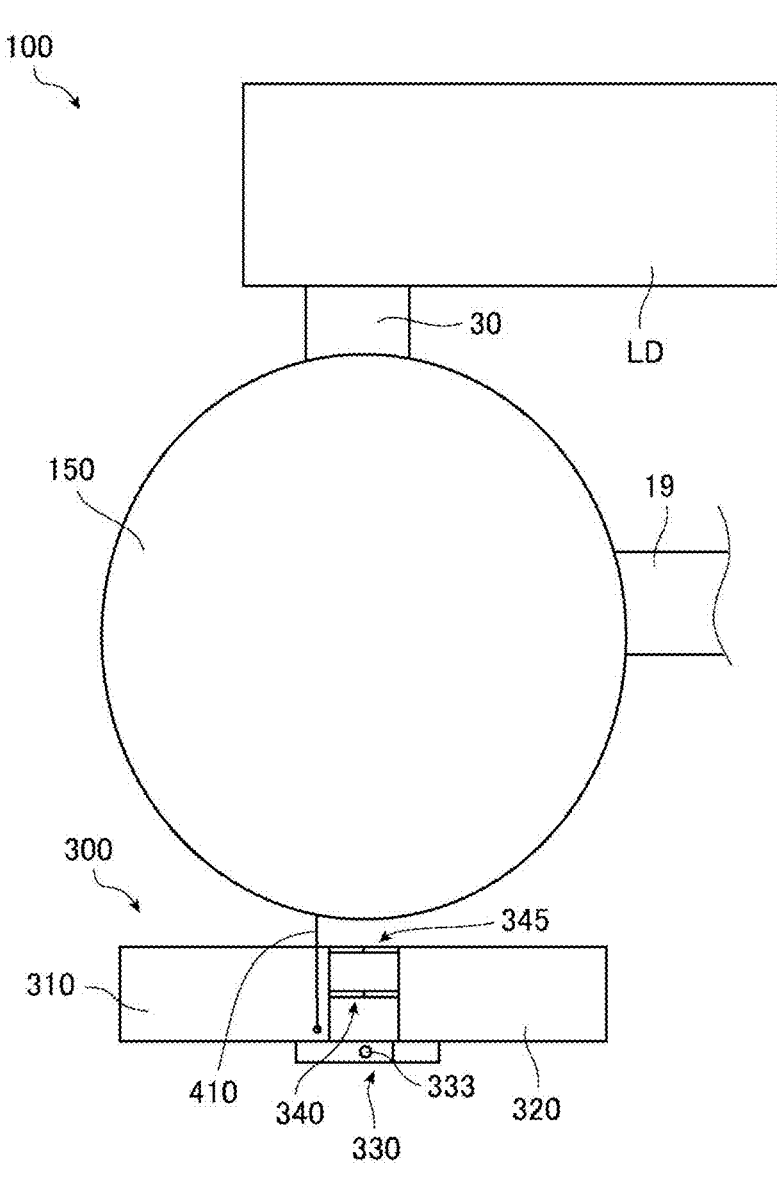
FIG. 4 is a schematic view of the extreme ultraviolet light generation apparatus of a first embodiment shown in the same manner as FIG. 3.

FIG. 4 is a schematic view of the EUV light generation chamber device 100 of the present embodiment shown in the same manner as FIG. 3. As shown in FIG. 4, in the EUV light generation apparatus 100 of the present embodiment, the configuration of the electric component box 300 is different from the configuration of the electric component box 300 of the comparative example. The electric component box 300 of the present embodiment includes a first box 310, a second box 320, connection devices 330, a partition plate 340, and a cover 345 as a main configuration.

Figure 5:
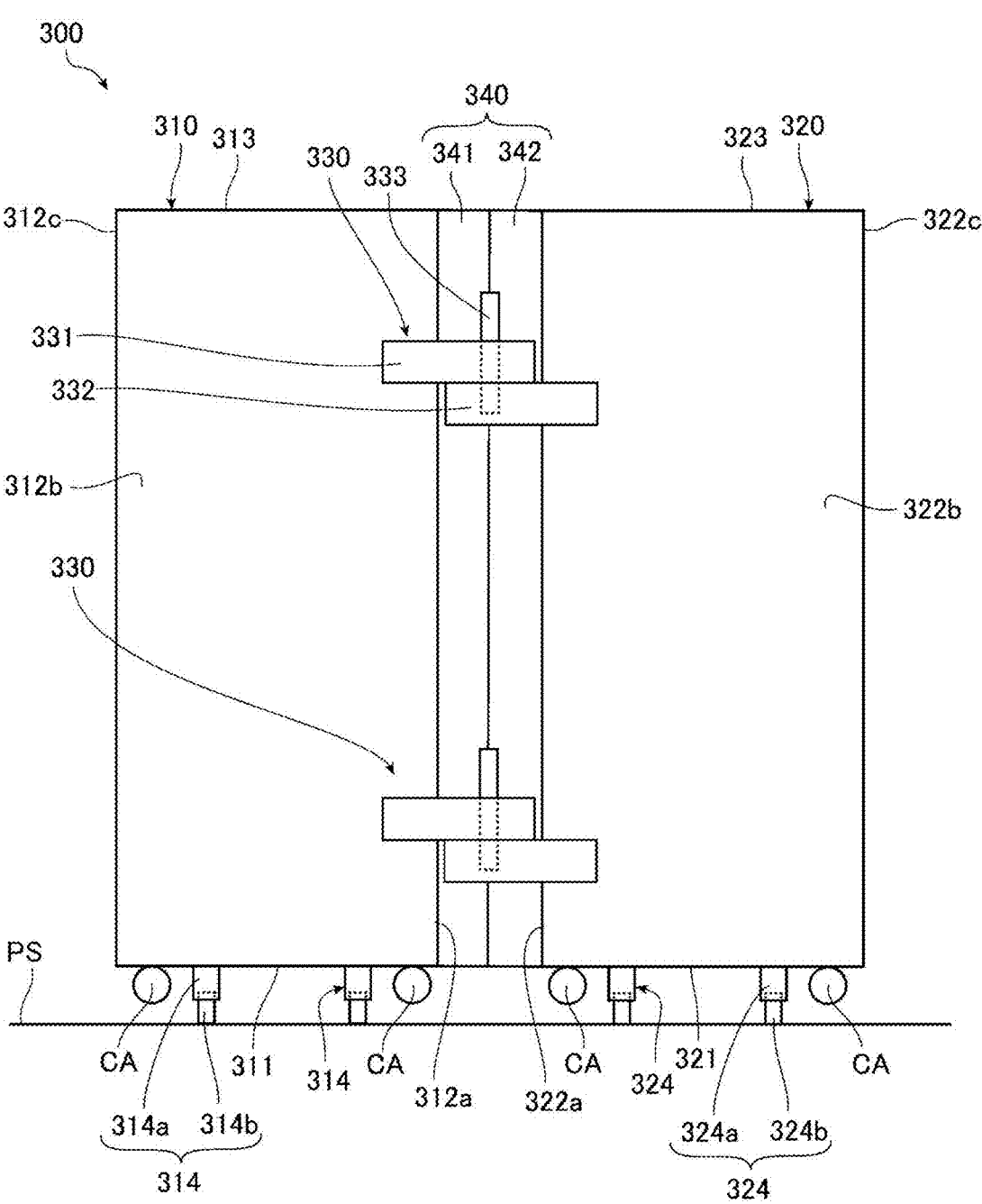
FIG. 5 is a schematic view showing an electric component box of the first embodiment.
Figure 6:
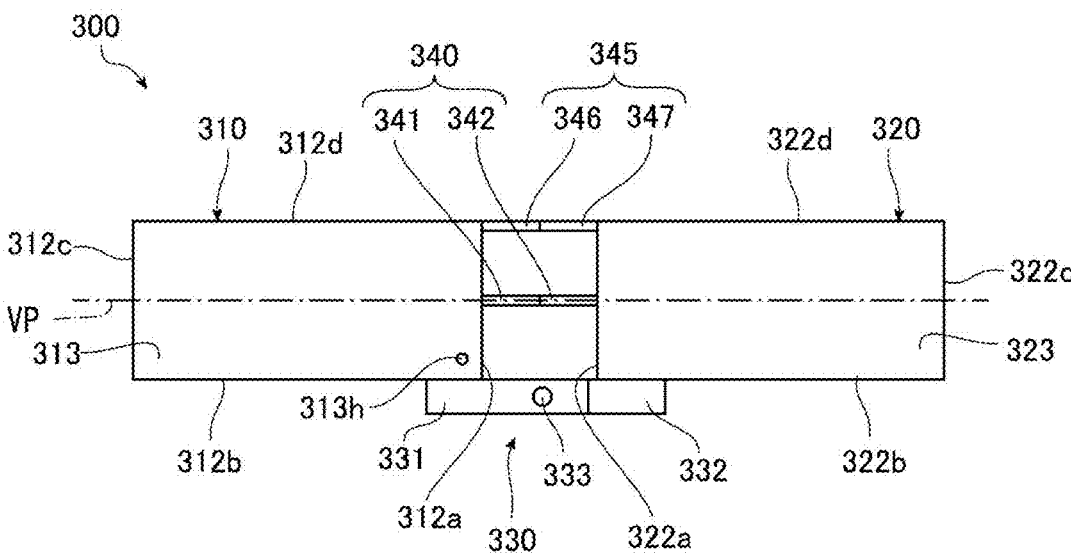
FIG. 6 is a schematic view of the electric component box of the first embodiment viewed from the upper side.

FIG. 5 is a schematic view showing the electric component box 300 of the present embodiment, and FIG. 6 is a schematic view of the electric component box 300 of the present embodiment viewed from the upper side. As shown in FIGS. 5 and 6, the first box 310 of the present embodiment is a box-shaped member having a space therein. In the present embodiment, the first box 310 has a rectangular a parallelepiped shape. The first box 310 includes rectangular lower wall 311, four rectangular side walls 312a to 312d connected to four sides of the lower wall 311 respectively, and a rectangular upper wall 313 faced to the lower wall 311 and connected to the side walls 312a to 312d. The side wall 312a and the side wall 312c face each other, and the side wall 312b and the side wall 312d face each other. The distance between the side wall 312a and the side wall 312c is longer than the distance between the side wall 312b and the side wall 312d.

The lower wall 311 is provided with four casters CA and four foot portions 314. In the present embodiment, each of the foot portions 314 includes a fixed portion 314a fixed to the lower wall 311 and a main body portion 314b. The main body portion 314b is a columnar member extending vertically, and an upper end portion of the main body portion 314b is screwed into a female screw provided in the fixed portion 314a. The foot portions 314 protrude downward from the lower wall 311. Further, by adjusting the amount by which the main body portion 314b is screwed into the female screw, the protrusion amount of the foot portion 314 protruding downward from the lower wall 311 can be adjusted. In the states shown in FIGS. 5 and 6, the lower end surfaces of the foot portions 314 are in contact with a placement surface PS, the casters CA are located above the placement surface PS, and the first box 310 is fixed to the placement surface PS. Although not shown, by increasing the amount by which the main body portion 314b is screwed into the female screw, the protrusion amount of the foot portions 314 is reduced, the first box 310 is lowered, and the casters CA come in contact with the placement surface PS. In such a state, the first box 310 is movable on the placement surface PS by means of the casters CA. In this state, the protrusion amount of the foot portions 314 is increased and the first box 310 is raised to separate the casters CA from the placement surface PS, so that the first box 310 is turned into a fixed state. That is, the first box 310 can be switched, by being raised and lowered, between the fixed state of being fixed to the placement surface PS and a movable state of being movable on the placement surface PS.

The second box 320 of the present embodiment is a box-shaped member having a space therein. In the present embodiment, the configuration of the second box 320 is substantially the same as the configuration of the first box 310, and the second box 320 has a rectangular parallelepiped shape. The second box 320 includes a rectangular lower wall 321, four rectangular side walls 322a to 322d connected to four sides of the lower wall 321 respectively, and a rectangular upper wall 323 faced to the lower wall 321 and connected to the side walls 322a to 322d. The side wall 322a and the side wall 322c face each other, and the side wall 322b and the side wall 322d face each other. The distance between the side wall 322a and the side wall 322c is longer than the distance between the side wall 322b and the side wall 322d.

The lower wall 321 is provided with four casters CA and four foot portions 324. Similarly to the foot portion 314, each of the foot portions 324 includes a fixed portion 324a fixed to the lower wall 321 and a main body portion 324b. The main body portion 324b is a columnar member extending vertically, and an upper end portion of the main body portion 324b is screwed into a female screw provided in the fixed portion 324a. The foot portions 324 protrude downward from the lower wall 321. Further, by adjusting the amount by which the main body portion 324b is screwed into the female screw, the protrusion amount of the foot portion 324 protruding downward from the lower wall 321 can be adjusted. In the states shown in FIGS. 5 and 6, the lower end surfaces of the foot portions 324 are in contact with the placement surface PS, the casters CA are located above the placement surface PS, and the second box 320 is fixed to the placement surface PS. Further, the second box 320 is arranged such that the side wall 322a faces the side wall 312a of the first box 310 with a space therebetween. As shown in FIG. 4, the first box 310 and the second box 320 are arranged along the outer periphery of the EUV light generation chamber device 150. When the side wall 312a and the side wall 322a face each other, the side wall 312b and the side wall 322b located on the opposite side with respect to the EUV light generation chamber device 150 are located on substantially the same plane. The side wall 312d and the side wall 322d located on the EUV light generation chamber device 150 side are located on substantially the same plane. In the following, a state in which the side wall 312a and the side wall 322a face each other may be referred to as a facing state. In the facing state, the side wall 312b and the side wall 322b are substantially parallel to each other.

Similarly to the first box 310, by increasing the amount by which the body portion 324b is screwed into the female screw, the protrusion amount of the foot portions 324 is reduced, the second box 320 is lowered, and the casters CA come in contact with the placement surface PS. In such a state, the second box 320 is movable on the placement surface PS by means of the casters CA. In this state, the protrusion amount of the foot portions 324 is increased and the second box 320 is raised to separate the casters CA from the placement surface PS, so that the second box 320 is turned into a fixed state. That is, the second box 320 can be switched, by being raised and lowered, between the fixed state of being fixed to the placement surface PS and the movable state of being movable on the placement surface PS.

The connection device 330 connects the first box 310 and the second box 320. In the present embodiment, the first box 310 and the second box 320 are connected by two upper and lower connection devices 330. Since the two upper and lower connection devices 330 have a similar configuration, one connection device 330 will be described below. Here, the number of the connection devices 330 is not limited.

Figure 7:
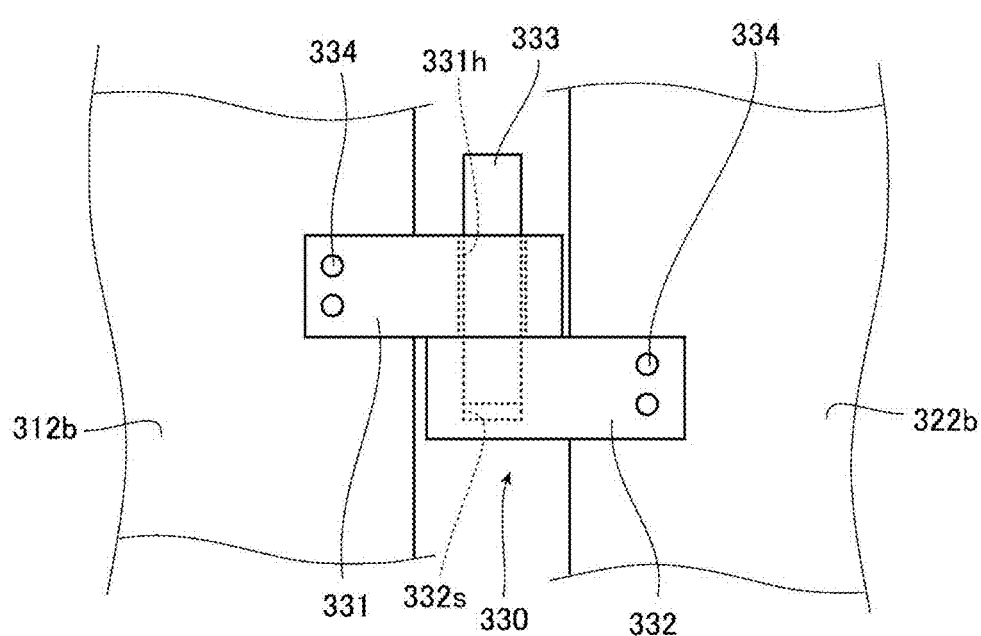
FIG. 7 is an enlarged view of a part including a connection device in FIG. 5.

FIG. 7 is an enlarged view of a part including the connection device 330 in FIG. 5. As shown in FIGS. 5, 6, and 7, the connection device 330 of the present embodiment includes a first blade portion 331, a second blade portion 332, and a cylindrical pin 333. The first blade portion 331 is a member fixed to the first box 310 and protruding at least partially toward the second box 320 in the facing state. The first blade portion 331 of the present embodiment is a quadrangular prism-shaped member, with one end part side thereof protruding substantially horizontally toward the second box 320 and the other end part side thereof fixed to the side wall 312b by bolts 334. A through hole 331h penetrating in the vertical direction is formed at the one end side.

The second blade portion 332 is a member fixed to the second box 320 and protruding at least partially toward the first box 310 in the facing state. The second blade portion 332 of the present embodiment is a quadrangular prism-shaped member, with one end part side thereof protruding substantially horizontally toward the first box 310 and the other end part side thereof fixed to the side wall 322b by bolts 334. The second blade portion 332 is located below the first blade portion 331 and overlaps the through hole 331h in the vertical direction. The second blade portion 332 is provided with a screw hole 332s extending downward from the upper surface, and the screw hole 332s vertically overlaps the through hole 331h. In the present embodiment, the upper surface of the second blade portion 332 is in contact with the lower surface of the first blade portion 331, but the second blade portion 332 and the first blade portion 331 may be apart from each other.

The diameter of the pin 333 is smaller than the diameter of the through hole 331h, and the pin 333 is inserted to the through hole 331h. The lower end part of the pin 333 protrudes downward from the through hole 331h and is screwed into the screw hole 332s of the second blade portion 332, and the pin 333 is fixed to the second blade portion 332. The method of fixing the pin 333 to the second blade portion 332 is not limited. Further, although the upper end part of the pin 333 protrudes upward from the through hole 331h, the upper end part of the pin 333 may not protrude from the through hole 331h.

The pin 333 in the upper connection device 330 and the pin 333 in the lower connection device 330 are located substantially coaxially.

The second blade portion 332 to which the pin 333 is fixed is rotatable with the pin 333 serving as the rotation axis with respect to the first blade portion 331. That is, the second box 320 is rotatably connected to the first box 310 by the connection device 330 with the pin 333 serving as the rotation axis.

The position of the pin 333 as the rotation axis is a position where the second box 320 rotates with respect to the first box 310, from the facing state in a direction in which the side wall 312a of the first box 310 and the side wall 322a of the second box 320 move away from each other, from the facing state. In the present embodiment, as shown in FIG. 6, the pin 333 as the rotation axis is located on the side opposite to the EUV light generation chamber device 150 with respect to a vertical plane VP passing through the center of the first box 310 and the center of the second box 320 in the facing state. Here, it is preferable that the second box 320 is connected to the first box 310 to be rotatable by 90 degrees or more.

Figure 8:
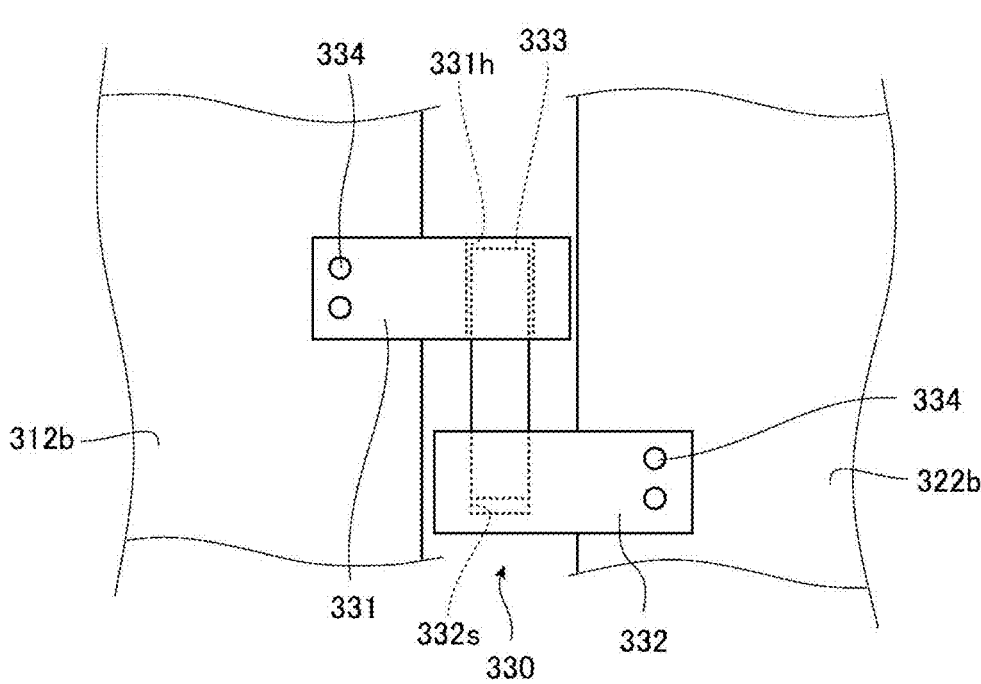
FIG. 8 is a view showing the connection device in the same manner as FIG. 7 in a state in which casters of a second box are in contact with a placement surface.

FIG. 8 is a view showing the connection device 330 in the same manner as FIG. 7 in a state in which the casters CA of the second box 320 are in contact with the placement surface PS. The pin 333 is inserted to the through hole 331h, but is not fixed to the first blade portion 331. Therefore, for example, when the second box 320 is lowered by means of the foot portions 324 from the state shown in FIG. 5, the pin 333 slides in the through hole 331h as shown in FIG. 8. That is, the second box 320 is connected to the first box 310 by the connection device 330 as being capable of being raised and lowered. Further, in the state in which the casters CA of the second box 320 are in contact with the placement surface PS, the pin 333 is inserted to the through hole 331h, and the state in which the first box 310 and the second box 320 are connected is maintained.

Here, the connection device 330 is only required to provide the connection as allowing the second box 320 to be rotatable with respect to the first box 310, from the facing state in a direction in which the side wall 312a of the first box 310 and the side wall 322a of the second box 320 move away from each other, from the facing state, and to be capable of being raised and lowered with respect to the first box 310.

Figure 9:
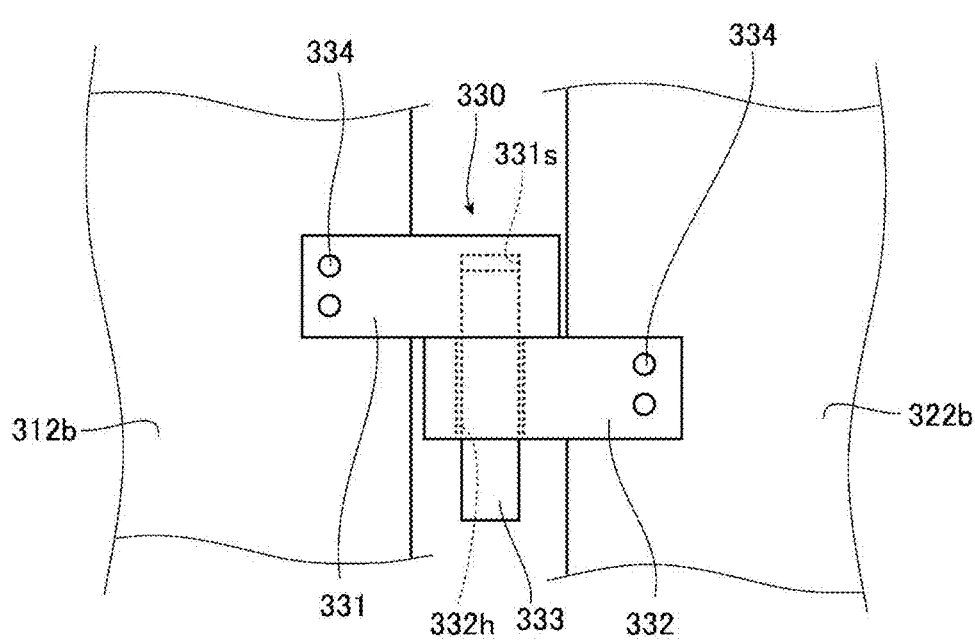
FIG. 9 is a view showing the connection device according to a modification shown in the same manner as FIG. 7.

FIG. 9 is a view showing the connection device 330 according to a modification shown in the same manner as FIG. 7. As shown in FIG. 9, in the present example, a through hole 332h penetrating in the vertical direction is formed in the second blade portion 332, and the pin 333 is inserted to the through hole 332h. The first blade portion 331 is provided with a screw hole 331s extending upward from the lower surface. The upper end part of the pin 333 protrudes upward from the through hole 332h and is screwed into the screw hole 331s of the first blade portion 331, and the pin 333 is fixed to the first blade portion 331. The lower end part of the pin 333 protrudes downward from the through hole 332h. The connection device 330 described above can also provide the connection as allowing the second box 320 to be rotatable with respect to the first box 310, from the facing state in a direction in which the side wall 312a of the first box 310 and the side wall 322a of the second box 320 move away from each other, from the facing state, and to be capable of being raised and lowered with respect to the first box 310.

Next, the partition plate 340 and the cover 345 will be described.

As shown in FIG. 6, the partition plate 340 is a plate-like member that is located between the side wall 312a of the first box 310 and the side wall 322a of the second box 320 and extending in a direction in which the side walls 312a, 322a face each other and the vertical direction in the facing state. The partition plate 340 of the present embodiment substantially overlaps the vertical plane VP, and is formed of a first plate portion 341 protruding from the side wall 312a toward the side wall 322a and a second plate portion 342 protruding from the side wall 322a toward the side wall 312a. It is preferable that the edge of the first plate portion 341 on the side wall 322a side and the edge of the second plate portion 342 on the side wall 312a side are in contact in the facing state. In this case, the second box 320 is prevented from rotating with respect to the first box 310, from the facing state in such a manner that the side wall 312a of the first box 310 and the side wall 322a of the second box 320 come closer to each other, from the facing state. Here, the partition plate 340 may not overlap the vertical plane VP.

Further, the positions of the upper and lower edges of the first plate portion 341 are preferably the same as the positions of the upper and lower edges of the side wall 312a, respectively, and the positions of the upper and lower edges of the second plate portion 342 are preferably the same as the positions of the upper and lower edges of the side wall 322a, respectively. Here, the partition plate 340 may consist only of the first plate portion 341, and in this case, it is preferable that the edge of the first plate portion 341 on the side wall 322a side is in contact with the side wall 322a in the facing state. Further, the partition plate 340 may consist only of the second plate portion 342, and in this case, it is preferable that the edge of the second plate portion 342 on the side wall 312a side is in contact with the side wall 312a in the facing state.

Similarly to the partition plate 340, the cover 345 is a plate-like member that is located between the side wall 312a of the first box 310 and the side wall 322a of the second box 320 and extending in a direction in which the side walls 312a, 322a face each other and the vertical direction in the facing state. The cover 345 is located on the side opposite to the pin 333 with respect to the partition plate 340. In the present embodiment, the cover 345 is along the edge of the side wall 312a on the side wall 312d side and the edge of the side wall 322a on the side wall 322d side, but may not be along these edges. The cover 345 includes a first plate portion 346 protruding from the side wall 312a toward the side wall 322a, and a second plate portion 347 protruding from the side wall 322a toward the side wall 312a. It is preferable that the edge of the first plate portion 346 on the side wall 322a side and the edge of the second plate portion 347 on the side wall 312a side are in contact in the facing state. In this case, the second box 320 is prevented from rotating with respect to the first box 310, from the facing state in such a manner that the side wall 312a of the first box 310 and the side wall 322a of the second box 320 come closer to each other, from the facing state.

Further, the positions of the upper and lower edges of the first plate portion 346 is preferably the same as the positions of the upper and lower edges of the side wall 312a, respectively, and the positions of the upper and lower edges of the second plate portion 347 is preferably the same as the positions of the upper and lower edges of the side wall 322a, respectively. Here, the cover 345 may consist only of the first plate portion 346, and in this case, it is preferable that the edge of the first plate portion 346 on the side wall 322a side is in contact with the side wall 322a in the facing state. Further, the cover 345 may consist only of the second plate portion 347, and in this case, it is preferable that the edge of the second plate portion 347 on the side wall 312a side is in contact with the side wall 312a in the facing state.

Next, the internal configuration of the first box 310 and the second box 320 will be described.

Figure 10:
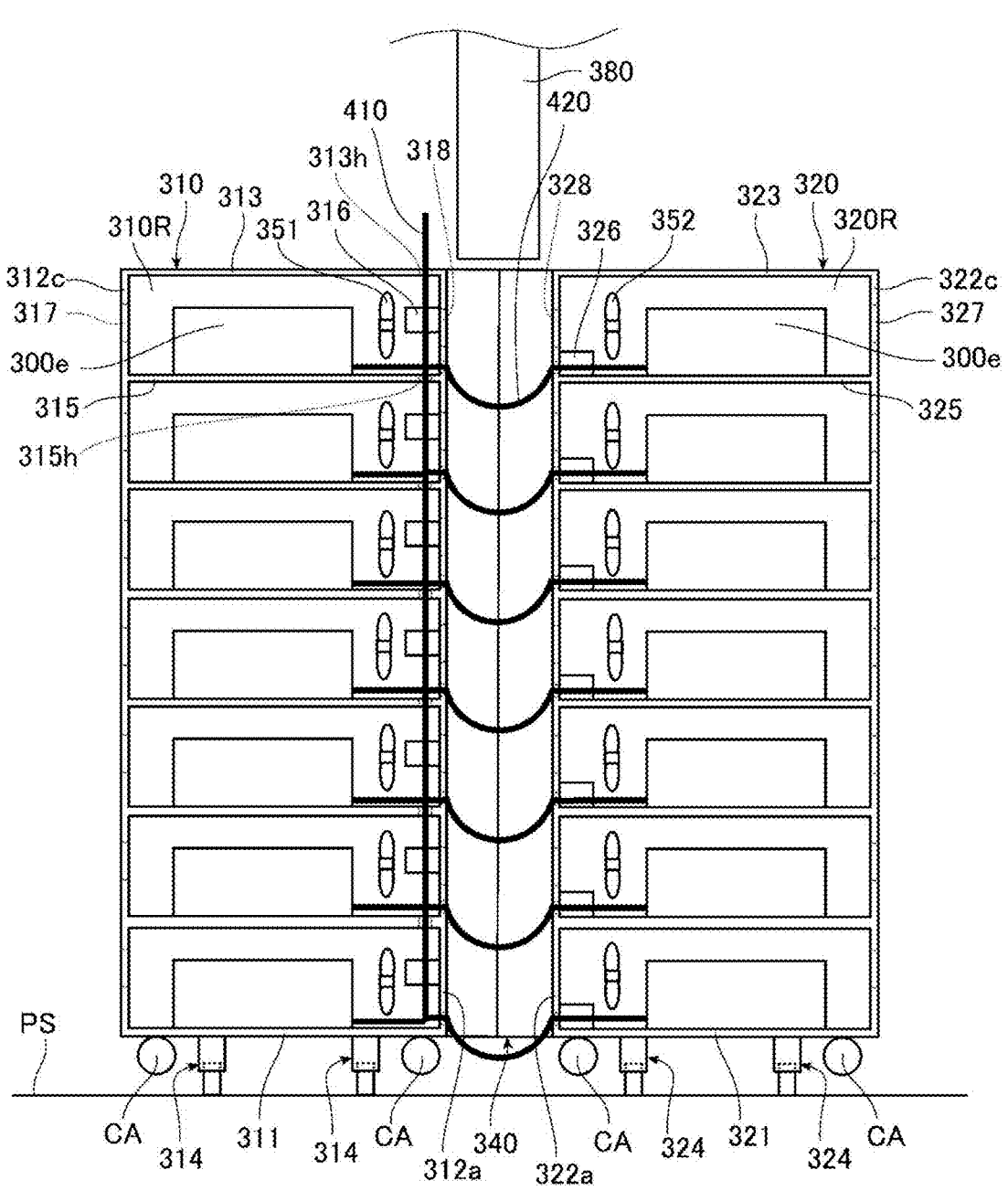
FIG. 10 is a schematic view showing the internal configuration of a first box and the second box.

FIG. 10 is a schematic view showing the internal configuration of the first box 310 and the second box 320, and is a schematic view showing the first box 310 with the side wall 312b removed and the second box 320 with the side wall 322b removed.

As shown in FIG. 10, the internal space of the first box 310 is divided into a plurality of spaces 310R arranged in the vertical direction by a plurality of shelf plates 315 extending in the horizontal direction, and the electric components 300e and the first fans 351 are accommodated in the respective spaces 310R. Further, similarly to the first box 310, the internal space of the second box 320 is divided into a plurality of spaces 320R arranged in the vertical direction by a plurality of shelf plates 325 extending in the horizontal direction, and the electric components 300e and second fans 352 are accommodated in the respective spaces 320R. In the present embodiment, the number of the spaces 310R and the number of the spaces 320R are the same, but may be different.

A through hole 313h is formed in the upper wall 313 of the first box 310, and the wiring 410 electrically connected to the electric components 150e of the EUV light generation chamber device 150 is introduced into the uppermost space 310R through the through hole 313h. The through hole 313h is located at a corner closest to the pin 333 among the four corners of the upper wall 313, but the position of the through hole 313h is not limited. Each shelf plate 315 is provided with a through hole 315h at a position overlapping the through hole 313h in the vertical direction. The wiring 410 is introduced into the respective spaces 310R through the through holes 313h, and is electrically connected to the electric components 300e accommodated in the spaces 310R. The wiring 410 introduced into the spaces 310R is fixed to, for example, the side wall 312a by wiring fixtures 316.

Figure 11:
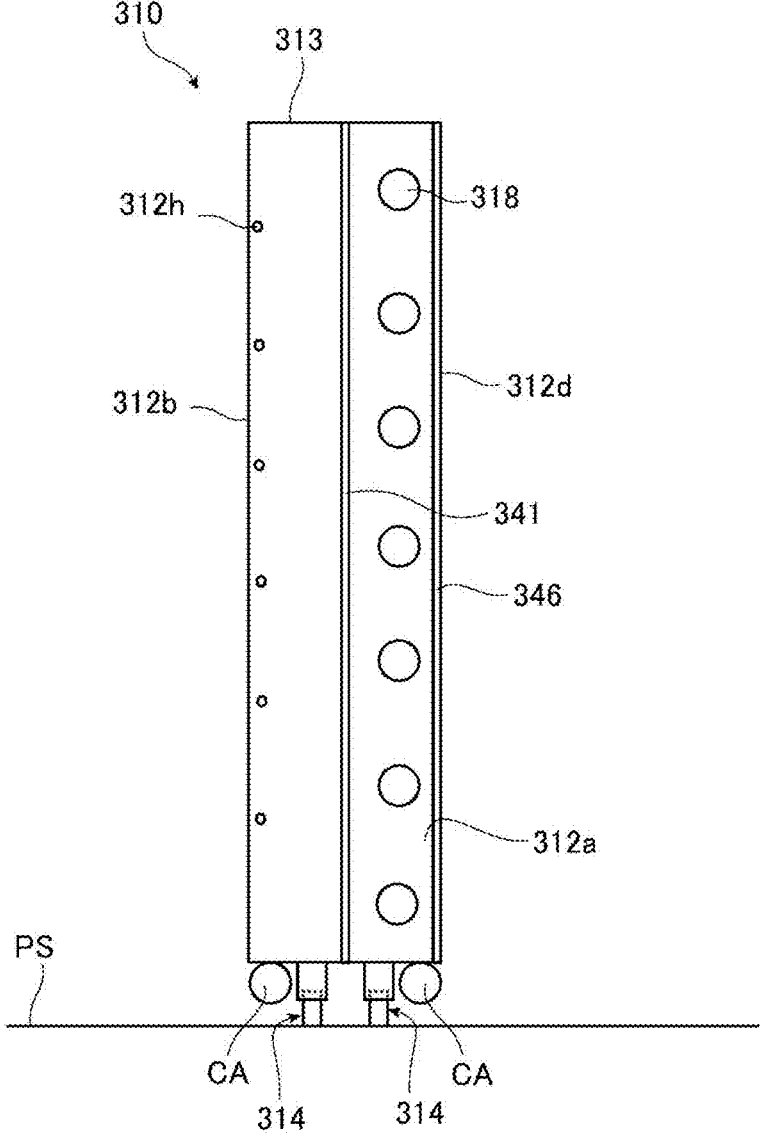
FIG. 11 is a schematic view of the first box viewed from the second box side.

FIG. 11 is a schematic view of the first box 310 viewed from the second box 320 side, and is a schematic view of the first box 310 when the side wall 312a is viewed from the front. As shown in FIGS. 10 and 11, the side wall 312a is provided with through holes 312h and exhaust ports 318 that communicate with the respective spaces 310R. The outer shape of the exhaust port 318 is, for example, a circular shape. The through holes 312h are located on the side wall 312b side with respect to the first plate portion 341, and the exhaust ports 318 are located between the first plate portion 341 and the first plate portion 346. Wirings 420 each connected to a part of the wiring 410 or the electric components 300e accommodated in the spaces 310R are led out from the through holes 312h to the outside of the first box 310. Here, the number of the through holes 312h is not limited. For example, a through hole 312h communicating with some of the spaces 310R among the plurality of spaces 310R may be formed.

Figure 12:
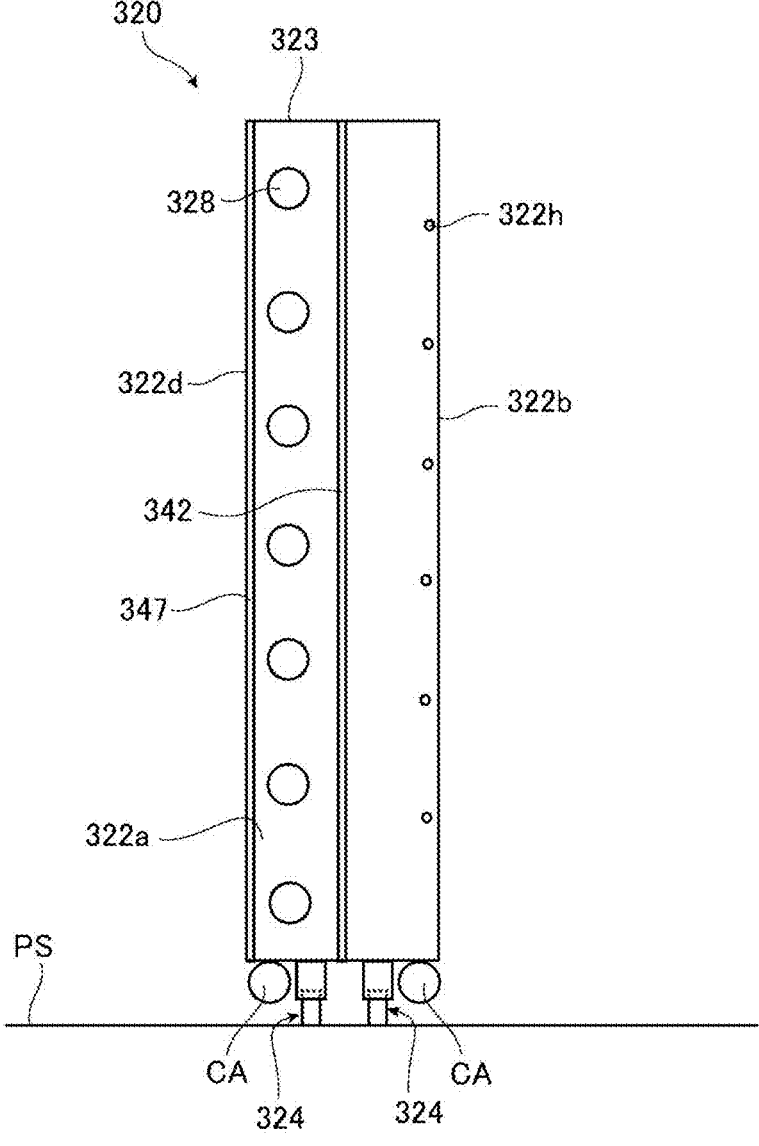
FIG. 12 is a schematic view of the second box viewed from the first box side.

FIG. 12 is a schematic view of the second box 320 viewed from the first box 310 side, and is a schematic view of the second box 320 when the side wall 322a is viewed from the front. As shown in FIGS. 10 and 12, similarly to the first box 310, the side wall 322*a* of the second box 320 is provided with through holes 322*h* and exhaust ports 328 that communicate with the respective spaces 320R. The through holes 322*h* are located on the side wall 322*b* side with respect to the second plate portion 342, and the exhaust ports 328 are located between the second plate portion 342 and the second plate portion 347. The outer shape of the exhaust port 328 is, for example, a circular shape. The wirings 420 led out from the first box 310 are introduced into the second box 320 through the respective through holes 322*h*, and are connected to the electric components 300*e*. The wirings 420 introduced into the spaces 320R are fixed to, for example, the side wall 322*a* by wiring fixtures 326. In the facing state, between the first box 310 and the second box 320, the wirings 420 are slackened as being located closer at the pin 333 side, which is the rotation axis, with respect to the partition plate 340 and the vertical plane VP.

Figure 13:
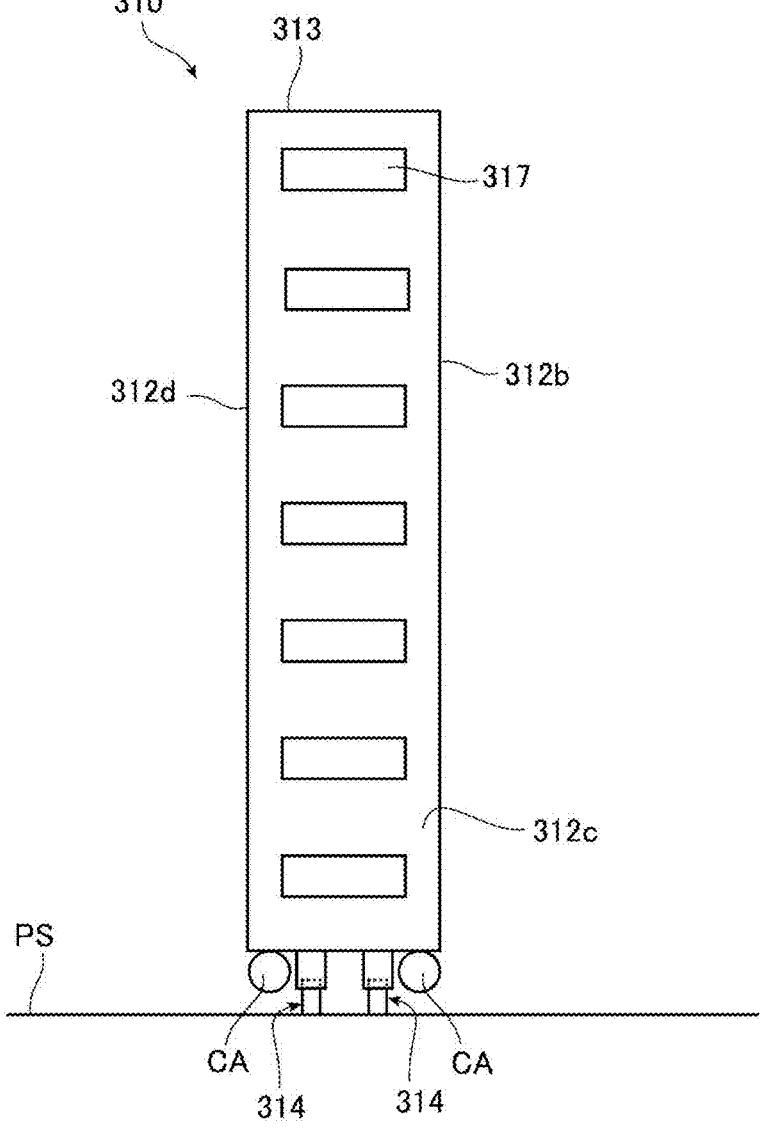
FIG. 13 is a schematic view of the first box viewed from a side opposite to the second box.

FIG. 13 is a schematic view of the first box 310 viewed from the side opposite to the second box 320, and is a schematic view of the first box 310 when the side wall 312*c* is viewed from the front. As shown in FIGS. 10 and 13, the side wall 312*c* is provided with air supply ports 317 communicating with the respective spaces 310R. The outer shape of the air supply port 317 is, for example, a rectangular shape. The first fans 351 are arranged to face the exhaust ports 318 on the side wall 312*a* side with respect to the electric component 300*e* in the space 310R. The first fan 351 feeds air in the space 310R toward the corresponding exhaust port 318. Here, as long as air in the space 310R is fed toward the exhaust port 318, arrangement of the first fan 351 is not limited.

Figure 14:
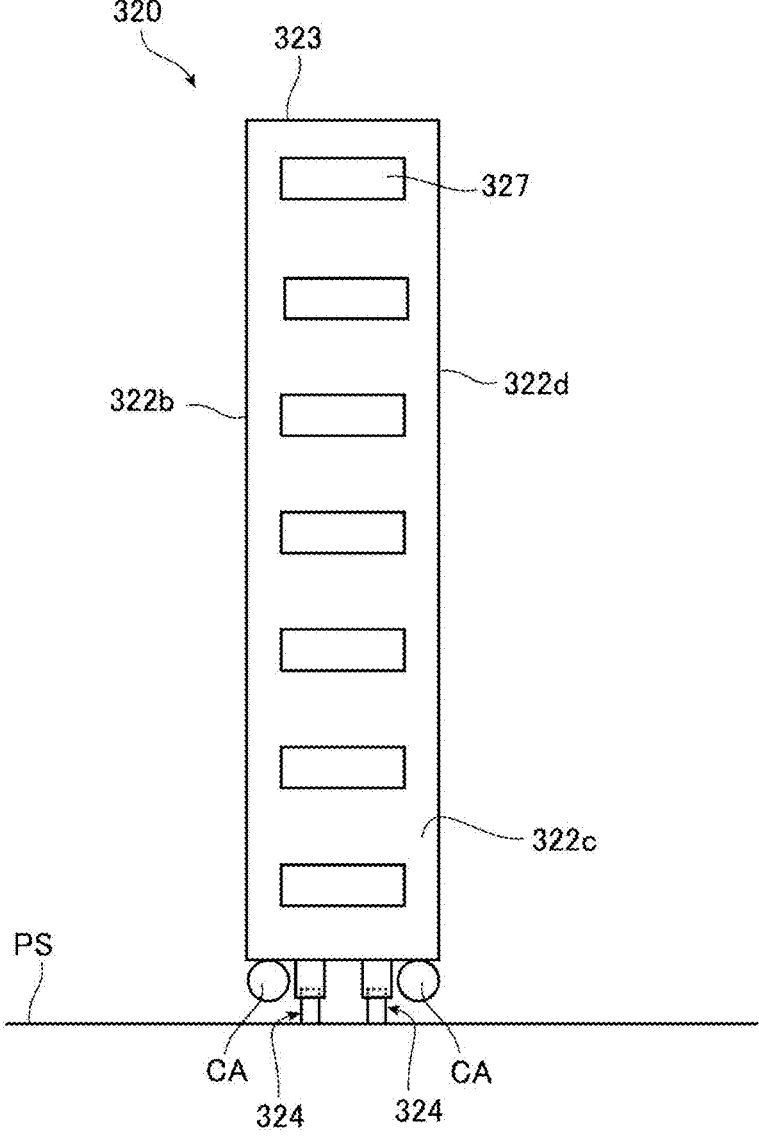
FIG. 14 is a schematic view of the second box viewed from a side opposite to the first box.

FIG. 14 is a schematic view of the second box 320 viewed from the side opposite to the first box 310, and is a schematic view of the second box 320 when the side wall 322*c* is viewed from the front. As shown in FIGS. 10 and 14, the side wall 322*c* is provided with air supply ports 327 communicating with the respective spaces 320R. The outer shape of the air supply port 327 is, for example, a rectangular shape. The second fans 352 are arranged to face the exhaust ports 328 on the side wall 322*a* side with respect to the electric component 300*e* in the space 320R. The second fan 352 feeds air in the space 320R toward the corresponding exhaust port 328. Here, as long as air in the space 320R is fed toward the exhaust port 328, arrangement of the second fan 352 is not limited.

As shown in FIG. 10, one end of a duct 380 connected to an exhaust device (not shown) is located above a space between the first box 310 and the second box 320 and between the partition plate 340 and the cover 345. Air between the first box 310 and the second box 320 on the side opposite to the pin 333 with respect to the partition plate 340 is fed from the duct 380 to the exhaust device and is exhausted by the exhaust device.

4.2 Operation

In the present embodiment, the first fans 351 and the second fans 352 cool the electric components 300*e*. The first fan 351 of the first box 310 feeds air in the space 310R toward the exhaust port 318. Therefore, a flow of air flowing into the space 310R from the air supply port 317 and flowing out from the exhaust port 318 is formed. Air flowing into the space 310R cools the electric component 300*e* accommodated in the space 310R, and air warmed by the heat of the electric component 300*e* flows out from the exhaust port 318. Further, the second fan 352 of the second box 320 feeds air in the space 320R toward the exhaust port 328. Therefore, a flow of air flowing into the space 320R from the air supply port 327 and flowing out from the exhaust port 328 is formed. Air flowing into the space 320R cools the electric component 300*e* accommodated in the space 320R, and air warmed by heat of the electric component 300*e* flows out from the exhaust port 328. The exhaust ports 318, 328 are provided in the side walls 312*a*, 322*a* facing each other, respectively. Therefore, air warmed by heat of the electric component 300*e* flows out from the exhaust port 318 and the exhaust port 328 into the space between the first box 310 and the second box 320, is fed from the duct 380 to the exhaust device, and is exhausted by the exhaust device.

4.3 Effect

Figure 15:
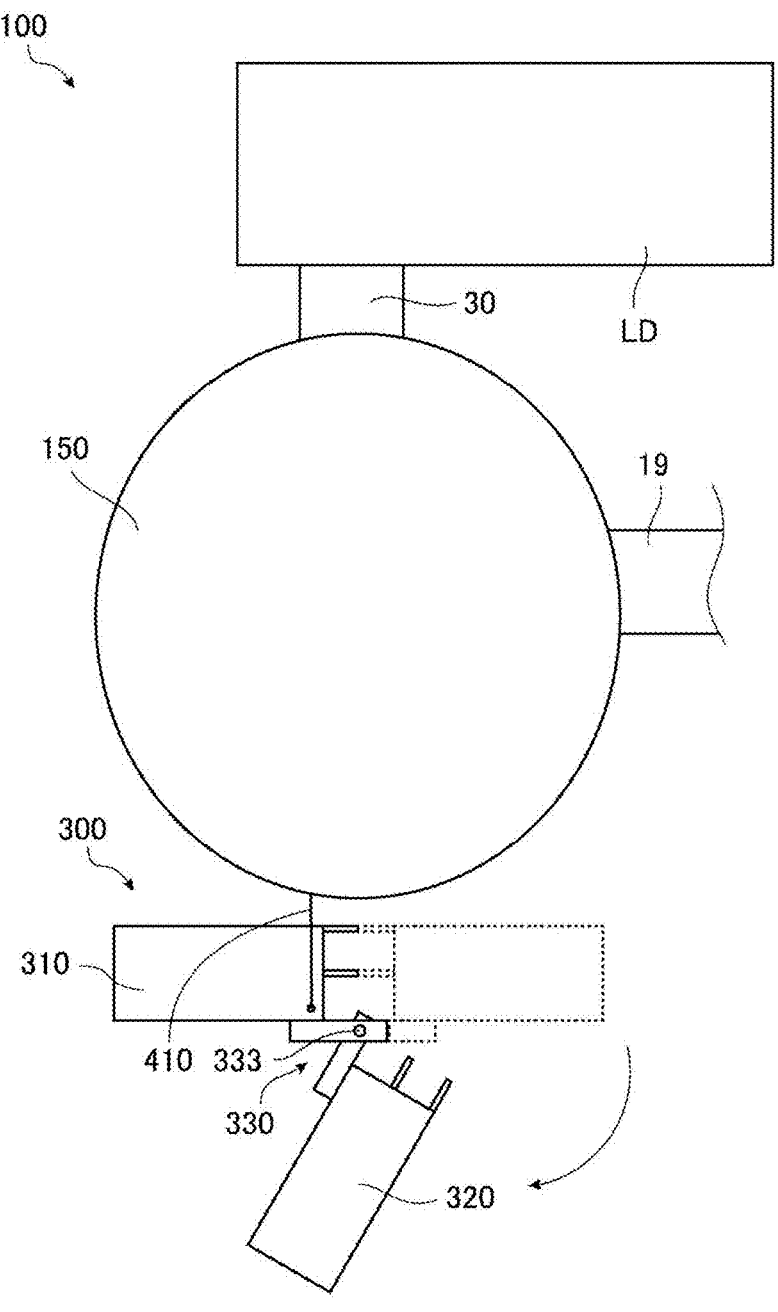
FIG. 15 is a view showing a state in which the second box is rotated with respect to the first box.

In the electric component box 300 of the present embodiment, the second box 320 is rotatable with respect to the first box 310, from the facing state in a direction in which the side wall 312*a* of the first box 310 and the side wall 322*a* of the second box 320 move away from each other, from the facing state. Therefore, as shown in FIG. 4, the pin 333 as the rotation axis of the second box 320 with respect to the first box 310 is located on the side opposite to the EUV light generation chamber device 150. With this arrangement, as shown in FIG. 15, the second box 320 can be moved away from the EUV light generation chamber device 150. Therefore, even when the electric component box 300 is not arranged away from the EUV light generation chamber device 150, it is possible to secure an area for maintenance of the EUV light generation chamber device 150 around the EUV light generation chamber device 150. Further, since the second box 320 rotates with respect to the first box 310, it is possible to suppress the second box 320 from being unintentionally separated from the first box 310 as compared with a case in which the second box 320 slides with respect to the first box 310. Therefore, it is possible to suppress a load from being applied to the wirings 420 introduced from the first box 310 to the second box 320. Further, since the second box 320 can be switched, by being raised and lowered, between the fixed state of being fixed to the placement surface PS and the movable state of being movable on the placement surface PS, the second box 320 can be easily fixed to the placement surface PS in a stable state.

In the electric component box 300 of the present embodiment, the wirings 420 introduced into the second box 320 from the first box 310 in the facing state are slackened. Therefore, according to the electric component box 300 of the present embodiment, compared with the case in which the wirings 420 are not slackened in the facing state, the wirings 420 can be less likely to receive a load when the second box 320 is rotated.

The wirings 420 are led out from the side wall 312*a* of the first box 310 to the outside of the first box 310, and are introduced from the side wall 322*a* of the second box 320 into the second box 320. In the facing state, the side wall 312*a* and the side wall 322*a* face each other. Therefore, according to the electric component box 300 of the present embodiment, the wirings 420 can be less likely to receive a load when the second box 320 is rotated while shortening the length of the wiring 420. Here, the side wall of the first box 310 through which the wirings 420 are led out and the side wall of the second box 320 through which the wirings 420 are introduced are not limited.

In the electric component box 300 of the present embodiment, the pin 333 that is the rotation axis is located on one side with respect to the vertical plane VP passing through the center of the first box 310 and the center of the second box 320 in the facing state, and the wirings 420 are located on the pin 333 side with respect to the vertical plane VP. Therefore, according to the electric component box 300 of the present embodiment, the wirings 420 can be less likely to receive a load when the second box 320 is rotated compared with a case in which the wirings 420 are located on the side opposite to the pin 333 with respect to the vertical plane VP. Here, the position of the wirings 420 is not limited.

In the electric component box 300 of the present embodiment, the side wall 312a of the first box 310 and the side wall 322a of the second box 320 are apart from each other in the facing state. Further, the exhaust port 318 is provided in the side wall 312a and the exhaust port 328 is provided in the side wall 322b. Therefore, according to the electric component box 300 of the present embodiment, the exhaust gas from the inside of the first box 310 and the second box 320 can be collected to between the first box 310 and the second box 320. Therefore, it is possible to suppress the exhaust gas from diffusing to the surroundings and affecting other devices. Here, the side wall 312a and the side wall 322a may be in contact with each other, and the side walls in which the exhaust ports 318, 328 are provided are not limited.

The electric component box 300 of the present embodiment includes the partition plate 340 that is located between the side wall 312a and the side wall 322a and extending in a direction in which the side wall 312a and the side wall 322a face each other and the vertical direction in the facing state. The exhaust port 318 of the first box 310 and the exhaust port 328 of the second box 320 are located on one side with respect to the partition plate 340, and the wirings 420 are located on the other side with respect to the partition plate 340. Therefore, according to the electric component box 300 of the present embodiment, it is possible to suppress the flow of air exhausted from the exhaust ports 318, 328 from being disturbed by the wirings 420 and suppress the air from remaining in the space between the first box 310 and the second box 320.

The electric component box 300 of the present embodiment includes the cover 345 that is located on one side with respect to the partition plate 340 between the side wall 312a of the first box 310 and the side wall 322a of the second box 320 and extending in a direction in which the side wall 312a and the side wall 322a face each other and the vertical direction in the facing state. The exhaust port 318 of the first box 310 and the exhaust port 328 of the second box 320 are located between the partition plate 340 and the cover 345. Therefore, according to the electric component box 300 of the present embodiment, compared with a case in which the cover 345 is not provided, it is possible to suppress the exhaust gas from diffusing to the surroundings and affecting other devices. Here, the electric component box 300 may not include the cover 345.

Although the embodiments of the present invention have been described above as examples, the above-described embodiments can be modified as appropriate. For example, the first box 310 only needs to be able to be fixed to the placement surface PS, and may be configured without the casters CA.

Further, the configuration of the switching between the fixed state and the movable state by raising and lowering is not limited to the foot portions 324 in which the protrusion amount can be adjusted. For example, each of the casters CA may be attached to the second box 320 via a connection portion having a configuration similar to that of the foot portion 324, and the protrusion amount of the foot portions 324 may not be adjustable. In this case, for example, the connection device 330 is configured such that the first blade portion 331 is located below the second blade portion 332.

Further, the electric component box 300 may not include the partition plate 340. Further, the first box 310 and the second box 320 may have a shape other than the rectangular parallelepiped shape.

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious to those skilled in the art that embodiments of the present disclosure would be appropriately combined. The terms used throughout the present specification and the appended claims should be interpreted as non-limiting terms unless clearly described. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of the any thereof and any other than A, B, and C.

What is claimed is:

1. An electric component box for accommodating an electric component to be connected to an electric component of an extreme ultraviolet light generation chamber device, the electric component box comprising:
a first box into which a wiring from the extreme ultraviolet light generation chamber device is introduced and which is capable of being fixed to a placement surface;
a second box into which a wiring from the first box is introduced and which is capable of being switched, by being raised and lowered, between a fixed state of being fixed to the placement surface and a movable state of being movable on the placement surface; and
a connection device providing connection between the first box and the second box as allowing the second box to be rotatable with respect to the first box, from a facing state in which a predetermined side wall of the first box and a predetermined side wall of the second box face each other, in a direction in which the predetermined side wall of the first box and the predetermined side wall of the second box move away from each other from the facing state, and to be capable of being raised and lowered with respect to the first box.

2. The electric component box according to claim 1, wherein the second box is rotatable by 90 degrees or more from the facing state with respect to the first box.

3. The electric component box according to claim 1, wherein the wiring introduced into the second box from the first box is slackened.

4. The electric component box according to claim 1, wherein the wiring introduced into the second box from the first box is led out to an outside of the first box from the predetermined side wall of the first box and is introduced to an inside of the second box from the predetermined side wall of the second box.

5. The electric component box according to claim 4, wherein a rotation axis of the second box with respect to the first box is located on one side with respect to a vertical plane passing through a center of the first box and a center of the second box, and the wiring introduced into the second box from the first box is located on the rotation axis side with respect to the vertical plane in the facing state.

6. The electric component box according to claim 1, wherein the predetermined side wall of the first box and the predetermined side wall of the second box are apart from each other in the facing state, and exhaust ports are provided in the predetermined side wall of the first box and the predetermined side wall of the second box, respectively.

7. The electric component box according to claim 6, further comprising a first fan configured to feed air in the first box toward the exhaust port of the first box and a second fan configured to feed air in the second box toward the exhaust port of the second box.

8. The electric component box according to claim 6, wherein air supply ports are provided in a side wall opposite to the predetermined side wall of the first box and a side wall opposite to the predetermined side wall of the second box, respectively.

9. The electric component box according to claim 6, further comprising a partition plate located between the predetermined side wall of the first box and the predetermined side wall of the second plate and extending in a direction in which the respective predetermined side walls face each other and the vertical direction, wherein the exhaust port of each of the first box and the second box is located on one side with respect to the partition plate, and the wiring introduced into the second box from the first box is located on the other side with respect to the partition plate.

10. The electric component box according to claim 9, wherein a rotation axis of the second box with respect to the first box is located on the other side with respect to the partition plate in the facing state.

11. The electric component box according to claim 1, wherein the second box is provided with casters which allow the second box to be movable on the placement surface.

12. The electric component box according to claim 1, wherein the second box is provided with foot portions protruding toward the placement surface and being capable of adjusting a protrusion amount thereof, and the foot portions cause the second box to be in the fixed state by coming into contact with the placement surface and raising the second box.

13. An extreme ultraviolet light generation apparatus comprising:

an extreme ultraviolet light generation chamber device configured to generate plasma by irradiation of a target substance with laser light; and an electric component box for accommodating an electric component to be connected to an electric component of the extreme ultraviolet light generation chamber device, the electric component box comprising:

a first box into which a wiring from the extreme ultraviolet light generation chamber device is introduced and which is capable of being fixed to a placement surface;

a second box into which a wiring from the first box is introduced and which is capable of being switched, by being raised and lowered, between a fixed state of being fixed to the placement surface and a movable state of being movable on the placement surface; and a connection device providing connection between the first box and the second box as allowing the second box to be rotatable with respect to the first box, from a facing state in which a predetermined side wall of the first box and a predetermined side wall of the second box face each other, in a direction in which the predetermined side wall of the first box and the predetermined side wall of the second box move away from each other from the facing state, and to be capable of being raised and lowered with respect to the first box.

* * * * *